United States Patent [19]

Miyazaki et al.

[11] Patent Number: 5,103,423
[45] Date of Patent: Apr. 7, 1992

[54] DYNAMIC RANDOM ACCESS MEMORY AND A METHOD OF OPERATING THE SAME

[75] Inventors: Yukio Miyazaki; Takenori Okitaka; Yasunori Maeda, all of Hyogo, Japan

[73] Assignee: Mitsubishi Denki Kabushiki Kaisha, Tokyo, Japan

[21] Appl. No.: 657,778

[22] Filed: Feb. 20, 1991

[30] Foreign Application Priority Data

Feb. 28, 1990 [JP] Japan .................................. 2-50396
Feb. 28, 1990 [JP] Japan .................................. 2-50397
Feb. 28, 1990 [JP] Japan .................................. 2-50398
Nov. 22, 1990 [JP] Japan ................................. 2-318754

[51] Int. Cl.⁵ ........................................ G11C 13/00
[52] U.S. Cl. ........................... 365/189.11; 365/189.01
[58] Field of Search ..................... 365/189.01, 230.01, 365/189.11, 1⁰⁰ ⁰⁴

[56] References Cited

U.S. PATENT DOCUMENTS 5,036,491 7/1991 Yamaguchi et al. ........... 365/189.04

OTHER PUBLICATIONS

"Introduction to MOS LSI Design", by J. Maber, Translated by T. Sugano et al., Apr. 20, 1984.

*Primary Examiner*—Terrell W. Fears
*Attorney, Agent, or Firm*—Lowe, Price, LeBlanc & Becker

[57] ABSTRACT

A dynamic RAM includes a memory cell comprised of a data read transistor, a data write transistor and a data storage capacitor. The data write transistor is turned on in response to a row selection signal to connect the capacitor to a write bit line. The dynamic RAM includes a structure for shifting the level of potential of internal write data to be transmitted onto the write bit line. This structure will prevent the data write transistor from being turned on by the undershoot produced on the write bit line.

15 Claims, 8 Drawing Sheets

DYNAMIC RANDOM ACCESS MEMORY AND A METHOD OF OPERATING THE SAME

BACKGROUND OF THE INVENTION

1. Field of the Invention

The present invention relates to a dynamic random access memory (hereinafter called "a dynamic RAM") and particularly a dynamic RAM comprising a memory cell including a capacitor for data storage and a transfer gate transistor for coupling the capacitor to a write-in data transmitting line.

2. Description of the Related Art

Semiconductor memories have heretofore been used in various fields with the advancement of the semiconductor technology.

One of such semiconductor memories is a dynamic RAM which utilizes a capacitor for data storage. Dynamic RAM is roughly grouped into two types depending on the memory cell structure. A memory cell of one type has one capacitor and one transistor, and is called one transistor/one capacitor type cell. A memory cell of the other type has three transistors and one capacitor, and is called three transistor/one capacitor type cell. Dynamic RAM has high integration density as compared to static RAMs, and is popularly employed in various fields requiring large storage capacity. One of the fields to which such semiconductor memories are applied is an image processing field. In the image processing field, image information is processed in a digital form. However, when it is desired to process digital image information at high speed, semiconductor memories are required which can execute writing of data therein and reading of data therefrom in a separate manner. One of such semiconductor memories is a dynamic RAM in which a data write path and data read path are separately provided.

Figure 1:
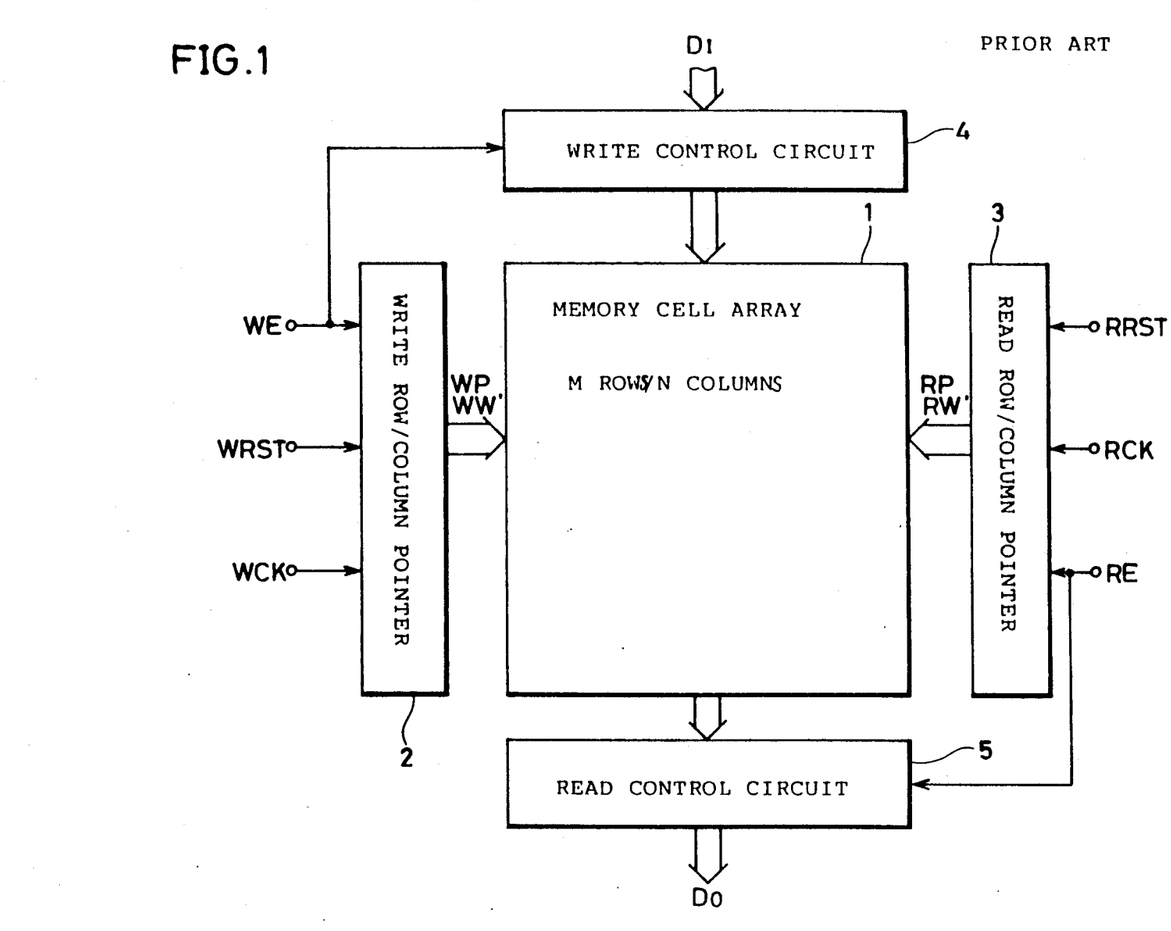
FIG. 1 is a block diagram showing one example of the overall structure of a conventional dynamic RAM.

FIG. 1 is a schematic diagram showing one example of the overall structure of a conventional dynamic RAM. The dynamic RAM shown in FIG. 1 is a serial access memory and is so constructed that address of the memory cell in which data is to be written and from which it is to be read out is incremented or decremented successively.

Referring now to FIG. 1, the conventional dynamic RAM includes a memory cell array 1 having a plurality of memory cells arranged in M rows and N columns, a write row/column pointer 2 for generating data write addresses WW and WP for specifying a memory cell to be subjected to data writing in the memory cell array 1 in response to a write enable signal WE, a write address reset signal WRST and a write clock signal WCK, a read row/column pointer 3 for generating data read addresses RW and RP for specifying a memory cell to be accessed for data reading in response to a read enable signal RE, a read address reset signal RRST and a read clock signal RCK, a write control circuit 4 activated in response to the write enable signal WE for generating internal write data corresponding to externally applied write data $D_I$ so as to transmit the same to the addressed memory cell, and a read control circuit 5 activated in response to the read enable signal RE for reading data from the addressed memory cell thereby to produce external read data $D_o$.

When the write enable signal WE is in an active state, the write row/column pointer 2 serves to increment or decrement the write addresses WW, WP successively in response to the write clock signal WCK. When the write address reset signal WRST is brought into an active state, the write row/column pointer 2 is initialized, so that the write address is reset to an initial value, for example, address "0", and writing of data into a memory cell is inhibited. In addition, the write clock signal WCK designates the timing for writing data into a memory cell, i.e., the timing for introducing externally applied write data $D_I$ into the inside of the device. The write address WW specifies memory cells corresponding to one row, which are to be subjected to data writing in the memory cell array 1, and the write address WP designates memory cells corresponding to one column, which are to be subjected to data writing in the memory cell array 1.

When the read enable signal RE is in an active state, the read row/column pointer 3 serves to increment or decrement the read address RP, RW successively in response to the read clock signal RCK. When the read address reset signal RRST becomes an active state, the read row/column pointer 3 is initialized, so that the read address is reset to an initial value, for example, address "0", and reading of data from a memory cell is inhibited. The read clock signal RCK specifies the timing for reading data from the memory cell, i.e., the timing for outputting the read data $D_o$ to the outside of the device. In addition, the read address RW designates memory cells corresponding to one row in the memory cell array 1, while the read address RP specifies memory cells corresponding to one column in the memory cell array 1.

The write control circuit 4 may include only an input buffer, which directly receives an externally applied write data $D_I$, for generating internal write data therefrom, or may include the input buffer and a write circuit with large driving capability which receives output data from the input buffer for performing further buffer processing of the same and for transmitting the processed data to the internal write data transmission line (selected column).

In general, the read control circuit 5 includes a read driver for detecting and amplifying data read from a selected memory cell and an output buffer for producing an external read data $D_o$ in response to an output from the read driver.

Figure 2:
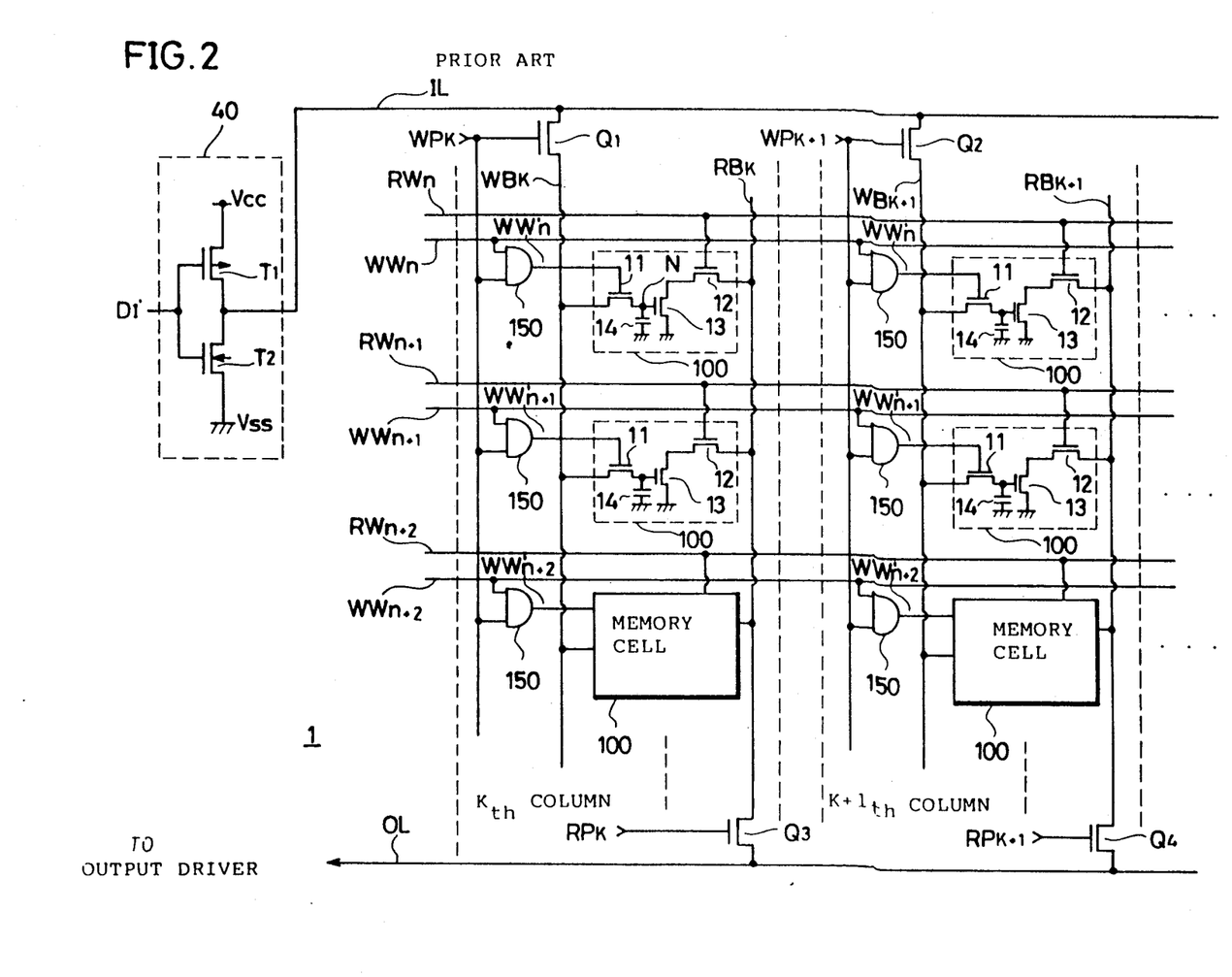
FIG. 2 is a circuit diagram showing a main portion of the dynamic RAM of FIG. 1.

FIG. 2 is a circuit diagram showing a main portion of the dynamic RAM of FIG. 1 in connection with writing of data therein. In the FIG. 2, the dynamic RAM used to write data therein and read out data therefrom on one bit unit is shown by way of illustrative example. The structure of the dynamic RAM of such three transistors-/one capacitor type is described in the technical article entitled "Introduction to MOS LSI Design", by J. Maber, and translated by T. Sugan et al., published by Sangyo Tosho Kabushiki Kaisha, Apr. 20, 1984, FIG. 5.28.

Referring to FIG. 2, a write row line WW and a read row line RW are arranged along the row direction of the memory cell array 1. A write row address WW is transmitted on the write row line WW while a read row address RW is transmitted on the read row line RW. Three write row lines RW are shown in FIG. 2, and three read row lines RW are also illustrated in the same figure. However, the write row line WW and the read row line RW are shown generically for respective row lines. A description will be made below with signal lines and signals transmitted on the signal lines designated with like reference characters.

A write bit line WB for transmitting internal write data therethrough and a read bit line RB for transmitting internal read data thereon are arranged in a column direction of the memory cell array 1. The bit lines WB and RB are also indicated generically for respective bit lines shown in FIG. 2.

A memory cell 100 is disposed at the intersection of the row line WW (or RW) and the bit line WB (or RB). In order to select 1-bit memory cell, an AND circuit 150 is provided for each memory cell. The AND circuit 150 has one input receiving a write address (a write row selection signal) WW and the other input receiving a write column address (a write column selection signal) WP. In addition, the AND circuit 150 produces a selection word signal WW'.

Each of the memory cells 100 has the structure of three transistors/one capacitor type and includes n-channel MOS transistors (n-channel insulated gate type field effect transistors, which are hereinafter called merely "nMOS transistors") 11, 12, 13, and a capacitor 14. The capacitor 14 serves to store information in the form of the electric charge therein. The nMOS transistor 11 is brought into ON state in response to the selection word signal WW' to connect the capacitor 14 to the write bit line WB. The nMOS transistor 13 receives at a gate thereof the information (charge potential) stored in the capacitor 14 to amplify the information stored in the capacitor 14. In addition, the nMOS transistor 12 is turned on in response to the read row address (read row selection signal) to transmit an output from the amplifying nMOS transistor 13 to the read bit line RB.

In order to transmit write data to a selected memory cell, there are provided nMOS transistors Q1, Q2 which are brought into a conductive state in response to the write column selection signal WP and connect the write bit line WB to an internal write data transmission signal line IL.

In order to select memory cells corresponding to one column upon reading, there are provided nMOS transistors Q3, Q4 which are brought into an ON state in response to the read column address (read column selection signal) RP and serve to connect a corresponding read bit line RB to an internal read data transmission signal line OL.

The internal write data transmission signal line IL is provided with a write driver 40 for generating internal write data in response to externally applied write data. The write driver 40 may be an input buffer itself or may be a circuit for buffering an output from the input buffer so as to generate internal write data therefrom. The write driver 40 has a p-channel insulated gate type field effect transistor (hereinafter called merely "pMOS transistor") T1 and an nMOS transistor T2 to form a CMOS inverter. The write driver 40 serves to invert a write data $D_I$ for transmission onto the internal write data transmission signal line IL.

The internal read data transmission signal line OL is connected to an output driver where the internal read data is detected and amplified to be outputted as external read data $D_o$ to an external device via an output buffer. A description will now be made of its operation.

Let's now consider where data representative of logic "1" is written into a memory cell 100 arranged at the position of n-th row and k-th column. It is assumed that logic "1" corresponds to the potential level indicated by "H" substantially equivalent to the level of the operating power supply voltage Vcc, while logic "0" corresponds to the potential level indicated by "L" substantially equivalent to the level of a second operating power supply voltage Vss such as the ground potential.

The write data $D_I$ of logic "0" is first supplied to an input of the write driver 40. This write driver 40 is comprised of an inverter and serves to transmit internal write data of logic "1" onto the internal write data transmission signal line IL.

The write row/column pointer 2 is responsive to the write clock signal WCK for raising the write column selection signal WPk to "H", so that the nMOS transistor Q1 is turned on. As a consequence, the internal write data of logic "1" on the internal write data transmission signal line IL is transmitted onto the write bit line WBk.

Then, a write row selection signal WWn on a write row line WWn is raised to "H". Since the write column selection signal WPk of "H" has already been applied to one of the inputs of the AND circuit 150, a write word signal WW'n of "H" is outputted from the AND circuit 150 so that a transistor 11 in the memory cell 100 arranged at the position of n-th row and k-th column is brought into an ON state. Thus, one electrode (storage nodes) N of the capacitor 14 is connected to the write bit line WBk and the internal write data of logic "1" is written or stored in the capacitor 14. As a consequence, the potential at the storage node N of the capacitor 14 is charged to the level of the power supply voltage Vcc.

In each of the memory cells on other rows and columns, an output from a corresponding AND circuit 150 is at the level of "L" and the transistor 11 in each of the memory cells is kept in an OFF state. As a consequence, the erroneous writing of data into other memory cells is inhibited. Thereafter, the write row selection signal WWn and the write column selection signal WPk fall to "L". The writing operation of the internal write data representative of logic "1" into the memory cell is terminated through the above-described operation.

When it is desired to write internal write data of logic "0" into a memory cell, data indicative of logic "1" is transmitted to the input of the write driver 40, and the same operation as described above is repeatedly executed. The operation of reading of data from the memory cell will now be described by way of an example in which data is read from a memory cell arranged at the position of n-th row and k-th column.

A read row selection signal on a read row line RWk is first raised to "H". Thus, data in memory cells corresponding to one row, which are connected to the read row line RWk, are transmitted over corresponding read bit lines RB. When data of logic "1" has been stored in the capacitor 14 in the memory cell, the amplifying transistor 13 is in an ON state. At this case, a read bit line RBk is connected to the ground potential Vss via the nMOS transistor 12 and the internal read data representative of logic "0" is transmitted onto the read bit line RBk.

When data of logic "0" has been stored in the capacitor 14 of the memory cell, the transistor 13 is in an OFF state and the signal potential at the read bit line RBk becomes the level of the power supply voltage Vcc corresponding to logic "1". Although not shown clearly in FIG. 2, the read bit line RB is provided with a precharge transistor for precharging the read bit line RB up to the level of the power supply voltage Vcc. Thus, each read bit line RB is precharged to level of the power supply voltage Vcc before reading of data.

Upon determination of the signal potential at the read bit line RB, a read column selection signal RPk is raised to "H". As a consequence, the nMOS transistor Q3 is turned on and the read bit line RBk is connected to the internal read data transmission signal line OL, so that the signal potential at the read bit line RBk is transmitted onto the internal read data transmission signal line OL. The signal potential at the internal read data transmission signal line OL is detected and amplified by the output driver, and then it is delivered as external read data $D_o$ to an external device via the output buffer.

A write row/column address and a read row/column address are generated in response to the write clock signal WCK and the read clock signal RCK. The clock signal WCK and RCK also control the timing for writing data into a memory cell and reading data therefrom. Thus, if the triggering timing (timing for triggering row/column selection and writing/reading of data in and from a memory cell) between the write clock signal WCK and the read clock signal RCK is set so as to be different from each other, the writing and reading of data in and from the same memory cell can substantially be executed simultaneously. It is therefore possible to obtain a dynamic RAM which can asynchronously and independently execute the operation of writing and reading of data in and from the memory cell.

Where the aforementioned dynamic RAM is a serial access memory, each of memory cells arranged over the range from a 1st row to an Mth row within a 1st column is selected successively and subsequently each of memory cells arranged over the range from the 1st row to the Mth row within a second column is selected successively. When this operation is repeated to select an memory cell arranged at the position of Mth row and Nth column, it is performed again to select a memory cell arranged at the position of 1st row and 1st column. This dynamic RAM can also function as an LIFO (Last in, First out) memory or FIFO (First in, First out) memory.

A plurality of memory cells are connected to a single write bit line WB. When the dynamic RAM has the storage capacity of, for example 4160 words (1 word size of 8 bits), the memory cell array has memory cells arranged in 130 rows×32 columns (one column size of 8 bits) and 130 memory cells are connected to each write bit line. Therefore, a significantly large parasitic capacitance is associated with the write bit line WB and the wiring resistance also exists therein. In order to eliminate the influence of RC delay caused by the parasitic capacitance and the wiring resistance and to change the signal potential at the write bit line WB at high speed, it is required to provide the write driver 40 having large driving capability. When it is desired to transmit the internal write data onto the write bit line WB using such a write driver 40 as referred to above, there is a possibility that data of logic "1", which has been stored in a memory cell, is destroyed. A description will be made in detail below on the reasons or circumstances on the matter referred to above.

Figure 3:
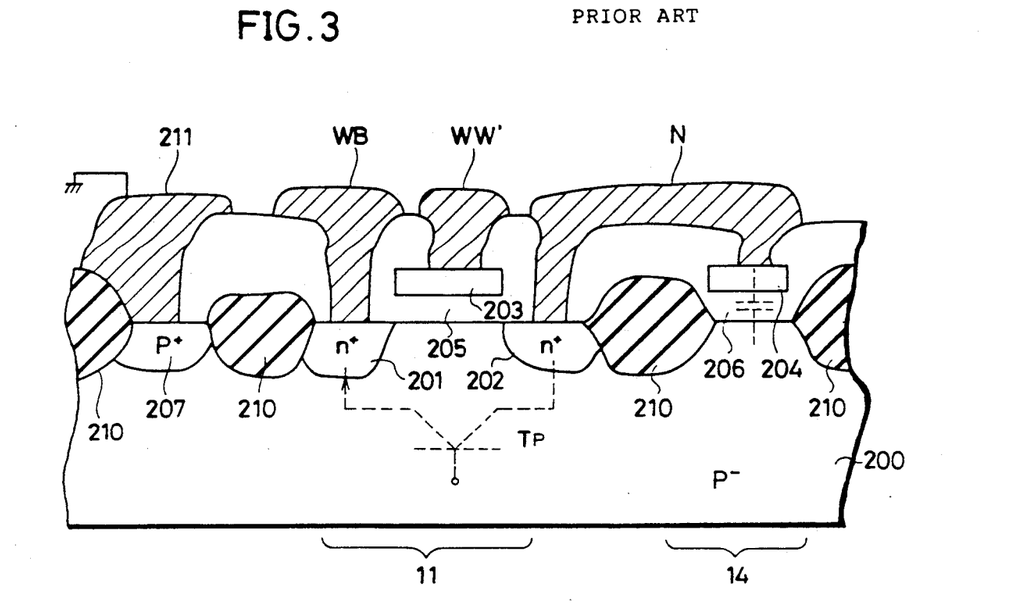
FIG. 3 is a cross-sectional view showing the structure of a memory cell of the dynamic RAM.

FIG. 3 is a partial cross-sectional view showing the structure of a single memory cell in connection with writing of data. In the FIG. 3, a writing memory cell transistor 11 comprises a p⁻semiconductor substrate 200 having a low impurity concentration, n+impurity regions 201, 202 formed in predetermined regions on the p⁻semiconductor substrate 200, a gate insulating film 205 formed on the surface of the semiconductor substrate 200 between the impurity regions 201 and 202, a gate electrode 203 comprised of, for example, polysilicon, which is formed on the gate insulating film 205.

The impurity region 201 is connected to the write bit line WB via a wiring layer formed of, for example, aluminum. The gate electrode 203 is connected to the write word line (output of the AND circuit 150) WW' through an interconnection layer formed of, for example, aluminum.

The capacitor 14 in each of the memory cells includes the semiconductor substrate 200, a capacitor insulating film 206 formed on the semiconductor substrate 200, an electrode layer 204 formed of, for example, polysilicon, which is formed on the capacitor insulating film 206. The semiconductor substrate 200 constitutes one electrode of the capacitor 14 and the electrode layer 204 constitutes a storage node of the capacitor 14. The electrode layer 204 is electrically connected to the impurity region 202 through the interconnection layer N formed of, for example, aluminum.

The semiconductor substrate 200 is biased with the ground potential Vss via a p+impurity region 207 having a high impurity concentration, which is formed on a predetermined surface region of the semiconductor substrate 200, and an interconnection layer 211 formed of, for example, aluminum.

In order to electrically separate respective cells on the surface region between the transistor 11 and the capacitor 14, an field insulating film 210 for the cell isolation is formed.

In the structure of the memory cell having the insulated gate type field effect transistors, there is formed a parasitic bipolar transistor Tp in which the impurity region 201 serves as the emitter, the impurity region 202 serves as the collector and the semiconductor substrate 200 serves as the base.

Figure 4:
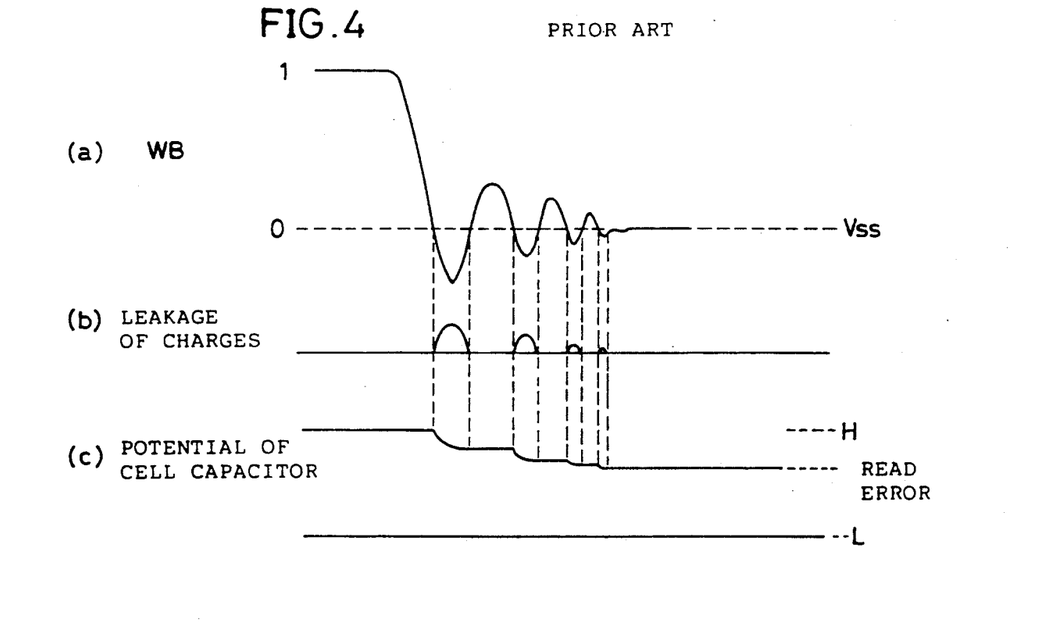
FIG. 4 is a signal waveform diagram illustrating variations in signal potential which is applied to write bit lines of the conventional dynamic RAM.

Let's now consider where date of logic "0", i.e., a signal having the level of the potential Vss is transmitted to the write bit line WB from the write driver 40. The write bit line WB also has the parasitic inductance as well as the parasitic capacitance and the wiring resistance. Due to existence of the parasitic capacitance and inductance, some undershoots occur as shown in FIG. 4 when the potential at the write bit line WB falls from "H" to "L", thereby causing the time interval during which the potential at the write bit line WB becomes lower than the potential Vss. The magnitude of the overshoot may be significant since, as mentioned earlier, driving capability of the driver 40 is high. Furthermore, means for reducing the inductance of drive lines as a means to reduce the size of ringing signal is known.

Since the level of the semiconductor substrate 200 is equal to that of the ground potential Vss, the base-to-emitter of the parasitic bipolar transistor Tp is biased in the forward direction due to the undershoots referred to above, so that the base current flows from the base of the parasitic bipolar transistor Tp to the emitter thereof and the parasitic bipolar transistor Tp is turned on.

Accordingly, even when the potential at the gate electrode 203 is "L" corresponding to the level of the ground potential Vss in a non-selected memory cell, the signal charge at the storage node N is delivered out to the write bit line WB through the parasitic bipolar transistor Tp if data of logic "1" has been stored in the storage node N. Thus, if the data of logic "1" has been stored in the capacitor 14 of the non-selected memory cell, a charge potential at the storage node N is reduced.

When the charge potential at the storage node N becomes lower than the threshold voltage of the amplifying transistor 13, the transistor 13 to be turned on upon reading of data is turned off and erroneous data is read out.

The more the dynamic RAM operates at high speed, and with the capacity of the memory device increased, the effect of parasitic inductance becomes greater, so that the undershoot in the signal potential at the write bit line WB excessively appears correspondingly.

Even when the charge potential of the capacitor 14 does not exceed the threshold voltage of the transistor 13, the electric charges stored in the capacitor 14 leak to the write bit line WB due to turn-on of the parasitic bipolar transistor caused by such undershoot as referred to above, so that the characteristic of holding the electric charges in the memory cell is deteriorated.

When it is desired to write data of logic "0" into a memory cell, the potential at the write bit line WB falls from "H" to "L" in FIG. 4. This shows that if the dynamic RAM is a serial access memory, the internal write data during previous write cycle becomes data of logic "1" and subsequently, the internal write data of logic "0" is transmitted to the write bit line WB because each of memory cells arranged on a single column (write bit line) is accessed successively.

In a dynamic RAM in which the write bit line is precharged to "H" level or the intermediate potential level before writing of data therein as an alternative to such a serial access memory as referred to above. The undershoot as described above, will occur in this bit line upon writing of the internal write data into the write bit line.

In order to prevent leakage of storage charges caused by such undershoot as referred to above, possible consideration is that the potential at the substrate 200 is biased to a negative potential $V_{BB}$. However, this dynamic RAM is generally integrated on the same substrate with other logic processing circuitry. When the bias voltage $V_{BB}$ is applied to the substrate 200, the logic processing circuit fails to operate at high speed because the threshold voltage of the MOS transistor is raised due to the back gate bias effect (substrate effect). It is not desirable to provide a on-chip $V_{BB}$ generator in view of a chip occupation area, its current consumption, and cost/performance thereof.

Such leakage of data charges due to the undershooting also occurs in one transistor/one capacitor type cell.

SUMMARY OF THE INVENTION

It is an object of the present invention to provide an improved dynamic RAM which eliminates drawbacks of the aforementioned conventional dynamic RAM.

Another object of the present invention is to provide a dynamic RAM having superior electric charge storage characteristics.

A further object of the present invention is to provide a stable and high-reliability dynamic RAM in which no malfunction occurs as a result of ringing on a bit line or a driving line.

A still further object of the present invention is to provide a dynamic RAM which can hold data therein with accuracy even when the ringing of the signal potential is developed on the (write) bit line.

The dynamic RAM according to the present invention includes circuitry for level-shifting an output from a write driver to transmit the same to a memory cell to be selected.

More specifically, the dynamic RAM according to the present invention comprises, in a write driver for producing bilevel internal write data having a first level corresponding to a first potential and a second level corresponding to a second potential, a driving element for deriving data having the second level including a level shifting element for shifting the second level to the direction of the first potential. In addition, the threshold voltage of an amplifying element provided within memory cell is shifted to the direction of the first potential.

Another dynamic RAM according to the present invention, includes impedance means between an output of the write driver and an input of each memory cell, for transmitting a first potential corresponding to one level of bilevel internal write data onto a write bit line through its intrinsic impedance.

In other words, another dynamic RAM according to the present invention includes impedance means having one terminal connected to the first potential (Vcc) and another terminal connected between an output of a data write circuit and each (write) bit line or connected to each (write) bit line.

The impedance means is preferably comprised of an insulated gate field effect transistor which is resistance-connected between the first potential and a point where it is located.

Further, the dynamic RAM according to the present invention preferably allows the threshold voltage which defines a transition voltage from an OFF state to an ON state of the amplifying switching transistor in a memory cell of three transistor/one capacitor type to be further shifted to the direction of the first potential.

When each of the memory cells includes nMOS transistors, the first potential corresponds to the level of the power supply voltage Vcc.

In the first-mentioned dynamic RAM, the potential of a (write) bit line under the ringing does not exceed the second potential because the level shifting element allows the signal potential of the write data corresponding to the second level to be shifted to the direction of the first potential, even when the ringing occurs in the signal potential upon writing of data onto the (write) bit line. Thus, the base-emitter of a parasitic bipolar transistor in each of the memory cells is always biased in the reverse direction, so that the parasitic transistor is ensurely kept in an OFF state. As a consequence, the signal charges stored in the capacitor in each of the memory cells is prevented from leaking to the internal write data transmission line or a bit line.

Since the level of potential corresponding to the internal write data having the second level is shifted to the direction of the first potential by the level shifting element, the level of potential which is stored in the capacitor of a memory cell at the time of storage of data having the second level is also shifted correspondingly. Since the threshold voltage of the amplifying element in a three transistor/one capacitor type cell is shifted to the direction of the first potential so as to compensate for the shifting of the potential level of the data having the second level, not only the reduction in the noise margin is prevented upon reading of data, but also erroneous reading of data from a memory cell is prevented as well.

The impedance means employed in said another dynamic RAM serves to transmit or supply the first potential to a point where it is disposed via the intrinsic impedance thereof. Thus, the potential corresponding to logic "0" on the (write) bit line becomes the level determined based on the ratio of the impedance of the impedance means to the on-resistance of a discharging transistor for charging to the second potential level included in the write driver. This first potential is the potential corresponding to that of logic "1" and allows the potential of logic "0" to be shifted a little from logic "0" to "1". Accordingly, even when the ringing, i.e., undershoot occurs in the (write) bit line (internal write data transmission line) upon writing of data, this (write) bit line can be held at the potential for keeping the parasitic bipolar transistor in an OFF state, thereby to prevent leakage of the signal charges from the capacitor in each of the memory cells to the (write) bit line.

Where the impedance means is constructed by means of the insulated gate field effect transistor which is resistance-connected, the impedance thereof can be set depending on the size of the transistor such as the width and length of the gate thereof and the possible lowest potential caused by the ringing on the write bit line can be set to the optimal value. Since the impedance means is formed by the insulated gate field effect transistor, the dynamic RAM can make use of the impedance means which permits efficient adjustment in the potential with the minimum area under the same production steps.

Further, since the impedance means allows the second level of the internal write data to be shifted to the direction of the first level, the potential stored in the capacitor of each memory cell and corresponding to the data having the second level is shifted to the direction of the first potential. At this time, the threshold voltage of the amplifying transistor of three transistor/one capacitor type cell is shifted to the first potential direction and compensates for the shifted charge potential corresponding to the data having the second level in the capacitor of a memory cell, thereby making it possible to ensure sufficient noise margin.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 5:
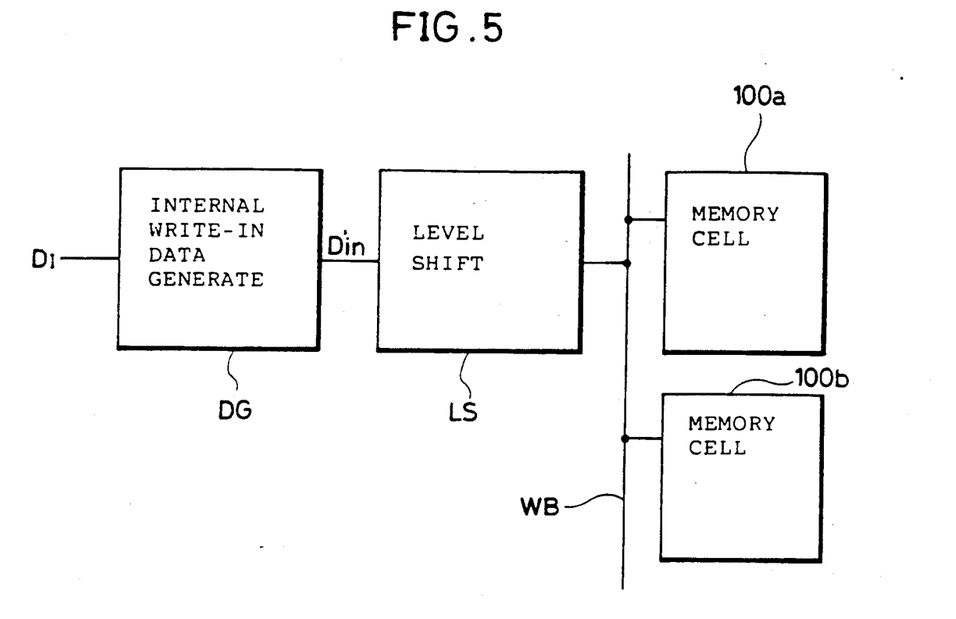
FIG. 5 illustrates conceptionally the arrangement of the memory device of the present invention.

FIG. 5 shows conceptionally the arrangement of the memory device according to the present invention. Referring to FIG. 5, internal write-in data generator DG generates internal write-in data $D_{IN}$ in response to externally applied write-in data $D_I$. Level shifter LS shifts up the level of data of "L" by a predetermined potential to "H" level direction. Shifted write-in data from the level shifter LS is transmitted onto the write bit line WB.

According to such arrangement, even if the undershooting is caused at the output of level shifter LS, the minimum level of the undershooting is kept above the substrate potential or ground level to prevent parasitic transistor from turning on.

Figure 6:
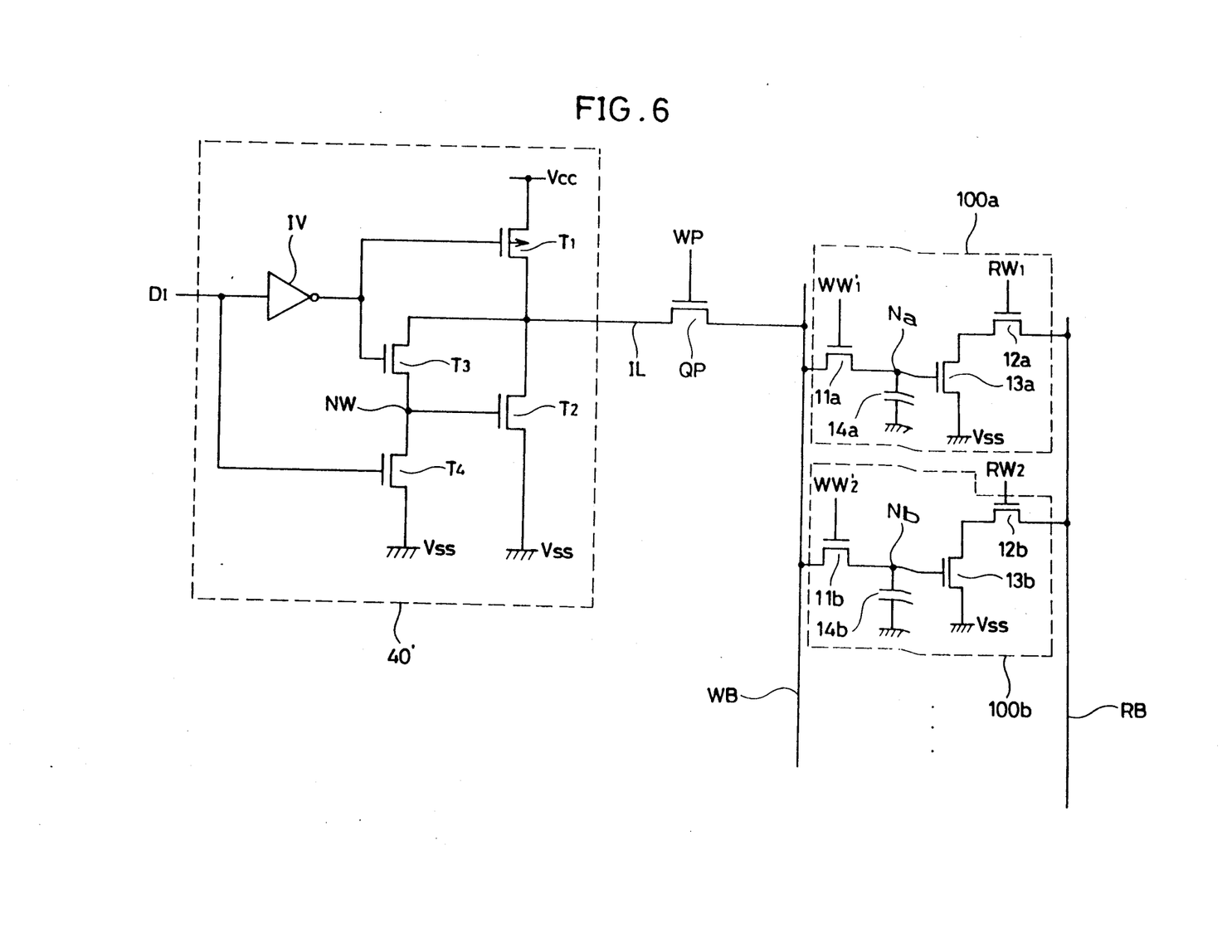
FIG. 6 is a circuit diagram showing a major portion of a dynamic RAM according to one embodiment of the present invention.

FIG. 6 is a circuit diagram showing the specific construction of an important portion of a dynamic RAM according to one embodiment of the present invention, in connection with writing of data therein. 2l-bit memory cells 100a and 100b are typically illustrated in FIG. 6. The parts corresponding to those in the conventional dynamic RAM shown in FIG. 2 are identified by like reference numerals or characters. The elements included in each of the memory cells 100a and 100b are identified by the same characters as those employed for the memory cells.

Referring to FIG. 6, a write driver 40' for producing internal write data includes an inverter IV for inverting write data $D_I$, and a circuit for producing the internal write data in response to the write data $D_I$ and an output from the inverter IV. This circuit has a pMOS transistor T1, and nMOS transistors T2, T3 and T4. The transistor T1 has one conduction terminal connected to a first power supply voltage Vcc, a gate coupled to the output of the inverter IV and other conduction terminal connected to an internal write data transmission signal line IL.

The transistor T2 has one conduction terminal connected to the internal write data transmission signal line IL, the gate connected to a node NW and other conduction terminal connected to a second power supply voltage (ground potential) Vss. Further, the transistor T3 has one conduction terminal connected to the internal write data transmission signal line IL, other conduction terminal connected to the node NW, and a gate coupled to the output of the inverter IV. The transistor T4 has one conduction terminal connected to the node NW, the gate supplied with the write data $D_I$, and other conduction terminal connected to the ground potential Vss.

The threshold voltage of each of amplifying transistors 13a and 13b employed in the memory cells 100a and 100b respectively is shifted toward a first potential, i.e., a power supply voltage Vcc from the threshold voltage of each of other MOS transistors. The shifting of the threshold voltage of each of the amplifying transistors 13a and 13b is realized by controlling the density of impurities to be injected into the channel region of each of the transistors 13a and 13b upon production of the dynamic RAM. As well known in the art, the threshold voltage Vth of MOS transistor and dopant density at the surface area of a channel region is expressed as follows:

$$V_{th} = V_{FB} + 2\psi_B + 2(\epsilon_S q N)^{\frac{1}{2}} \cdot (2\psi_B)^{\frac{1}{2}}/CO.$$

$$\psi_B = \frac{kT}{q} \ln\left(\frac{N}{n_I}\right)$$

where
 $V_{FB}$: flatband voltage,
 k: Boltzman constant,
 T: absolute temperature,
 q: electric charge of electron
 N: dopant density,
 $n_I$: free electron density of intrinsic semiconductor
 $\epsilon_S$: dielectric constant of a semiconductor
 CO: capacitance of MOS capacitor between gate electrode and semiconductor per unit value As seen from the expression, the threshold voltage of MOS transistor can be well controlled by adjusting the concentration of doped impurity to obtain a desired threshold voltage of transistors 13a and 13b. A description will now be made of its operation.

Let's first consider a case where the write data $D_I$ is logic "1". A signal of logic "0", i.e., a signal indicative of "L" is outputted from the inverter IV so that the pMOS transistor T1 and the nMOS transistor T4 are brought into an ON state while the nMOS transistor T3 becomes an OFF state. A potential at the node NW is brought into the level of the ground potential Vss due to turn-on of the transistor T4, and the transistor T2 becomes an OFF state. As a consequence, a signal of the level of the power supply voltage Vcc, i.e., the internal write data indicative of logic "1" is transmitted through the pMOS transistor T1 to the internal write data transmission signal line IL.

Then, the selection signals WP and WW, are raised to "H" successively, so that data of logic "1" is written into a selected memory cell and the voltage level at the node N (Na or Nb) of a capacitor in the selected memory cell is brought into the power supply voltage Vcc.

Let's next consider a case where the write data $D_I$ is logic "0". In this case, data of logic "1", i.e., a signal of "H" is outputted from the inverter IV, so that the pMOS transistor T1 and the nMOS transistor T4 are brought into an OFF state while the nMOS transistor T3 becomes an ON state. The transistors T2 and T3 are Darlington-connected to each other. Accordingly, when the potential at the internal write data transmission signal line IL is "H", the potential indicative of this "H" is transmitted or supplied to the gate of the nMOS transistor T2 through the nMOS transistor T3, so that the transistor T2 is turned on. As a consequence, the internal write data transmission signal line IL is discharged through the transistor T2, which signal potential drops from "H" to "L", and the data of logic "0" is transmitted to the internal write data transmission signal line IL.

Figure 7:
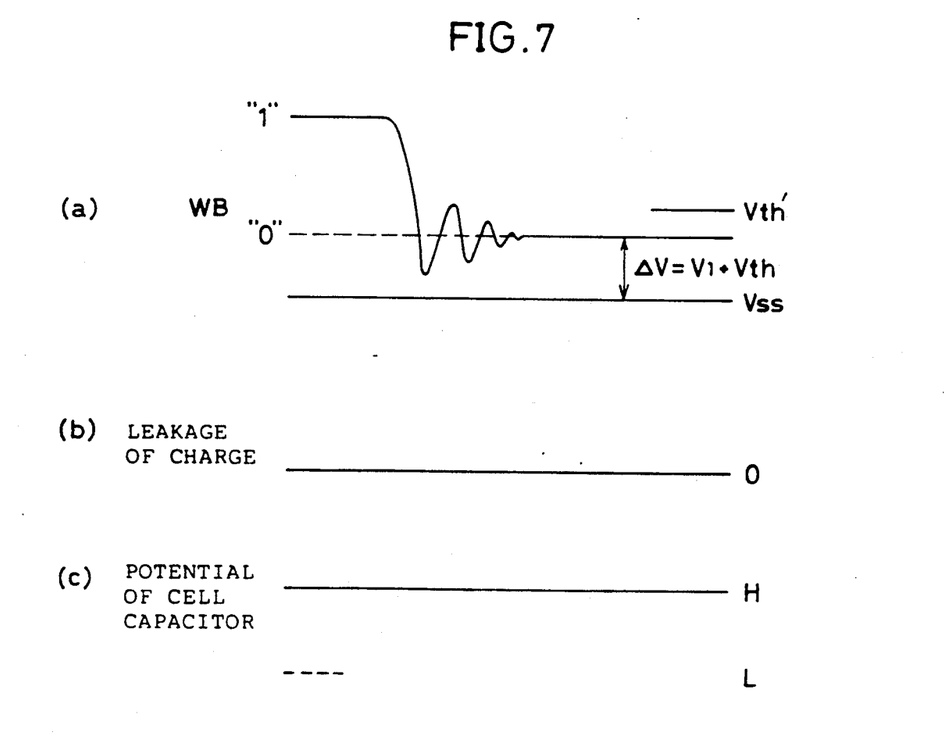
FIG. 7 is a signal waveform diagram illustrating variations in signal potential applied to a write bit line of the dynamic RAM of FIG. 6.

When the voltage between the gate and the source of the nMOS transistor T2 reaches the threshold voltage Vth thereof, the nMOS transistor T2 becomes an OFF state, so that the discharging of the signal line IL is stopped. Accordingly, the potential achieved on the internal write data transmission signal line IL and a write bit line WB is expressed as follows:

$$\Delta V = V_{SS} + V1 + V_{th}$$
$$\approx 0.7 V$$

where V1 is the voltage between the drain and the source of the transistor T3, produced by on resistance of the transistor T3, and Vth is the threshold voltage of the transistor T2. In general, the amplitude of the undershoot in the potential, which undershoot appears at the write bit line WB, is sufficiently smaller than $\Delta V$ as shown in FIG. 7. Thus, the voltage between the base and the emitter of a parasitic bipolar transistor Tp in the memory cell is kept in a reverse bias state even when any undershoot appears in this write bit line WB upon writing of logic "0". As a consequence, no electric charge, which is stored in a capacitor in each non-selected memory cell leaks to the write bit line.

Then, a write word signal WW' is raised to "H" and the internal write data representative of logic "0" is written into a corresponding selected memory cell, so that the potential at the storage node N of the capacitor in the selected memory cell is brought into the level of $\Delta V$.

The operation of data reading is executed in the same manner as the conventional example. At this case, the threshold voltage Vth' of the amplifying transistor 13 (13a, 13b) is set to a value for compensating for the level shifting $\Delta V$ of the data representative of logic "0". Thus, even when the data of logic "0" has been level-shifted, the threshold voltage Vth' of the amplifying transistor 13 and ←V satisfies the following relation:

$$Vth' > \Delta V$$

Therefore, the transistor 13 is ensurely brought into an ON state or OFF state in accordance with stored data (the potential charged at the storage node N), so that a erroneous data reading is avoided.

The threshold voltage Vth' of transistors 13a and 13b should be decided to provide sufficient noise margin. If the shift-up potential is 0.5 V and the threshold voltage of an ordinary MOS transistor is 0.6 V, the increase of the threshold voltage of MOS transistors 13a and 13b by 0.4 V to 0.6 V may be sufficient to obtain sufficient noise margin.

When the difference between the quantity of the level shifting $\Delta V$ and the threshold voltage Vth' is a value similar to that in the conventional dynamic RAM, the noise margin upon reading of data can be made of the order of the same as that in the conventional memory. It is thus feasible to prevent the reduction in the noise margin and execute the data reading stably and en-surely.

In the above-described embodiment, the write data $D_I$ is reversed in logic level to an internal read data which appears at a read bit line RB. Thus, if an inverter is provided at the preceding stage of the write driver 40' or an inverter is provided on a path between an input of an output driver and an output terminal of the memory device, read data $D_o$ corresponding to the write data D: can be obtained.

Also assuming that the inverter IV is disposed between the input terminal ($D_I$) and the gate of the transistor T4 and that the write data $D_I$ is directly given to the gates of the transistors T1 and T3 in the construction of the write driver illustrated in FIG. 6, the logic relation between the internal write data and the internal read data, which relation is the same as that in the conventional dynamic RAM depicted in FIG. 2, can be achieved while performing the level shifting of the write data.

The write driver 40' is included in a write control circuit 4 illustrated in FIG. 1, and may be an input buffer itself or may be a driver circuit different from the input buffer. Namely, this may be a device that directly drives the internal write data transmission lines (including the internal write data transmission signal line IL and the write bit line WB).

In the write driver 40', the level shifting is achieved by Darlington-connected transistors for performing the discharge of the internal write data transmission line. However, the same advantageous effect as the above-described embodiment can be obtained by any circuit construction as far as the construction shifts the potential corresponding to the data representative of logic "0".

Figure 8:
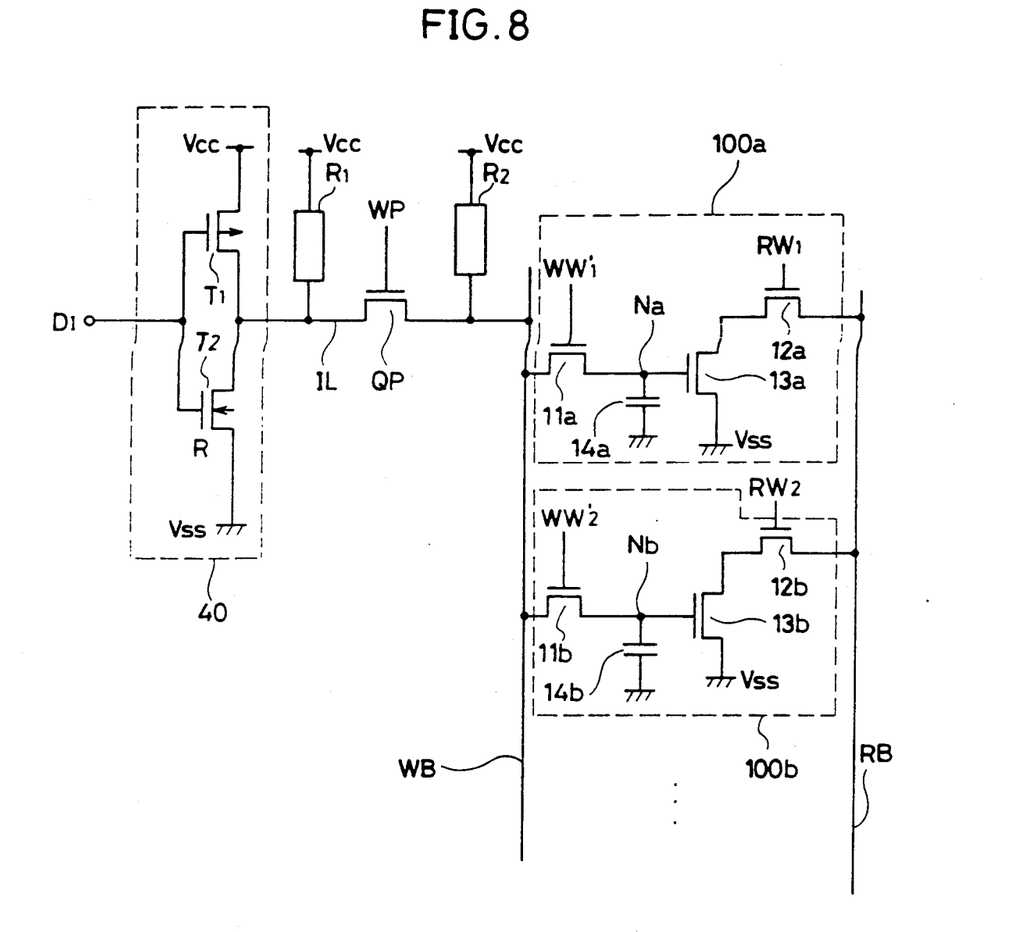
FIG. 8 is a circuit diagram showing a major portion of a dynamic RAM according to another embodiment of the present invention.
Figure 9:
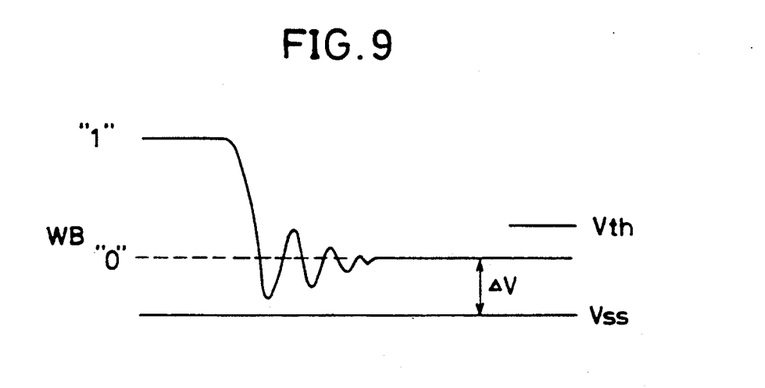
FIG. 9 is a signal waveform diagram illustrating variations in the signal potential applied to a write bit line of the dynamic RAM of FIG. 8.

FIG. 8 shows the construction of a main portion of a dynamic RAM according to another embodiment of this invention. In the following description, a write row selection signal is assumed to include both of a write row address decode signal WW and a write word signal WW', and an internal write data transmission line is assumed to include both of an internal write data transmission signal line IL and a write bit line WB. The dynamic RAM shown in FIG. 8 includes a first impedance element R1 provided between a first potential such as the power supply voltage Vcc and the internal write data transmission signal line IL, and a second impedance element R2 connected between the power supply voltage Vcc and the write bit line WB. These impedance elements R1, R2 have appropriate impedance values. The data write driver 40 has the same construction as that shown in FIG. 2. A description will now be made of its operation.

Let's now consider a case where a write data D: is logic "1" corresponding to the potential "H". Further, let's now assume that a column selection signal WP is "H" and a transistor QP is in a conduction state. At this case, the potential determined based on the ratio of the impedance of each of the impedance elements R1, R2 to the on-resistance of the transistor T2 included in the write driver 40 is transmitted to the writ bit line WB as data representative of logic "0". In other words, when the impedance values of the impedance elements R1, R2 are given as R1, R2 respectively and the on-resistance of the transistor T2 is also given as R, the potential corresponding to the data of logic "0" is given by the following expression because the value of the direct current resistance of the write bit line WB is substantially negligible.

$$\Delta V = R \cdot Vcc/(R1//R2 + R)$$

where Vss is equal to zero. The potential level corresponding to logic "0" on the write bit line WB is increased by $\leftarrow V$ from the voltage Vss. This value of $\leftarrow V$ can be adjusted so as to be a proper value arbitrarily by adjusting the impedance values of the impedance elements R1, R2.

The write bit line WB has the stray inductance L and the parasitic capacitance C as in the conventional examples. When an output from the write driver 40 is changed at high speed, the undershoot will occur due to the ringing. However, the lowest achievable potential of this undershoot is raised by $\Delta V$ because of existence of the impedance elements R1, R2. Therefore, the potential at the write bit line WB can be rendered higher than the ground potential Vss as illustrated in FIG. 8 whatsoever undershoot occurs. It is thus possible to always keep the base-emitter of the parasitic bipolar transistor Tp shown in FIG. 3 in a reversal biased state, so that the transistor Tp can be maintained in an OFF state at all times. As a result, even when information representative of logic "1" has already been stored in a capacitor 14a of a non-selected memory cell 100a, no signal charges stored therein are transmitted onto the write bit line WB. Therefore, the potential representative of logic "1" which has previously been written therein is ensurely maintained.

The provision of the impedance elements R1 and R2 allows the potential level of logic "0" to be raised by $\Delta V$. Accordingly, the charge potential (the potential at the node N) corresponding to logic "0" in the capacitor 14 of the memory cell also becomes $\Delta V$. If this potential $\Delta V$ stored in the capacitor becomes higher than the threshold voltage Vth of the transistor 13 (13a, 13b), the transistor 13 is always in an ON state irrespective of logics "1" and "0", so that data cannot be read out accurately. It is therefore necessary to set the potential level corresponding to logic "0" to a value lower than the threshold voltage Vth of the transistor 13 (13a, 13b).

As such impedance elements may be used arbitrary impedance means such as a resistor comprising polysilicon. The structure for establishing the impedance value to a most efficient and optimal value will be shown in FIG. 10.

Figure 10:
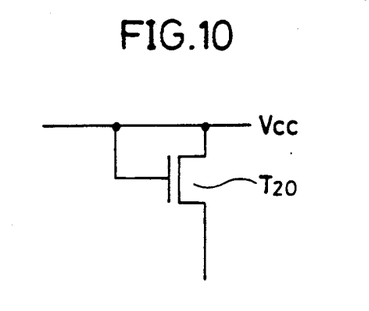
FIG. 10 is a diagram showing one specific example of an impedance element.

Referring now to FIG. 10, as the impedance element, there is provided an nMOS transistor whose gate and drain are connected to a power supply potential Vcc as a first potential and whose source is connected to an internal write data transmission signal line IL or write bit line WB. When an insulated gate type field effect transistor is resistance-connected as shown, it can be used as load means with a specific resistance value.

When an insulated gate field effect transistor is employed as an impedance element, this load transistor has the same structure as that of the MOS transistor included in the memory cell and is also subjected to variations in characteristics similar to those of transistors which constitute a dynamic RAM even with variations of element parameters, changes in the supply voltage and variations in atmospheric temperature or the like in the production steps of the dynamic RAM. It is thus possible to compensate for the changes in such parameters so as to transmit the optimal potential corresponding to the logic "0" on the write bit line WB even when such parameters as referred above are varied.

When polysilicon is employed as a load resistor, i.e., an impedance element, polysilicon resistor requires a larger occupation area and makes difficult the establishment of its optimal value (because of variations in the production parameters, operation parameters, etc. as described above). However, when an nMOS transistor is employed as an impedance element, the impedance value (on-resistance) can easily be set to the optimal value by adjusting the size of the transistor such as its gate length, its gate width, etc., and also an area for the impedance element can be rendered minimal by the nMOS transistor. It is therefore, possible to obtain the impedance element which can correct the signal potential on the write bit line WB with ease and accuracy without increasing an area occupied by the impedance element in the memory.

The impedance elements R1 and R2 are not required to provide to both of the internal write data transmission signal line IL and the write bit line WB.

It is possible to bring about the same advantageous effect as the above-described embodiment even when the impedance element is provided to either one of the internal write data transmission signal line IL and the write bit line WB.

Further, although the n-channel MOS transistor has been used as the impedance element, a p-channel MOS transistor may be used as a load transistor. In addition, it is also feasible to obtain the same advantageous effect as the above-described embodiment even when the memory cell is constructed by pMOS transistors.

When it is desired to realize the level shifting of the write data by providing the above-described impedance element, the threshold voltage of each of the amplifying transistors 13a, 13b in the memory cells must be greater than the potential level (Vss+←−V) corresponding to logic "0". It is however considered that the potential level corresponding to logic "0" may be raised due to noise, thereby to cause malfunction of the amplifying transistors 13a, 13b. It is preferable to set the threshold voltage of each of the amplifying transistors 13a, 13b so as to be sufficiently high in order to assure a sufficient noise margin.

If the quantity of shifting of the threshold voltage Vth of each of the amplifying transistors 13a, 13b is substantially the same as the shifting quantity $\Delta V$ of the potential level corresponding to the data representative of logic "0", the noise margin of the same order as that of the conventional dynamic RAM can be ensured. Its specific value is set to a proper one in accordance with circuit parameters and its operational characteristics. Even in the case of generation of the undershoot on the write bit line WB, data can accurately be maintained without its influence. In addition, the threshold voltage of each of the amplifying transistors 13a, 13b is so adjusted that a sufficient margin is ensured with respect to the shifted potential level of the data of logic "0". Thus, the reduction in the noise margin can be prevented and a stable, malfunction-free and high-reliability dynamic RAM can be obtained.

A description has been made of a serial access memory as the dynamic RAM in the above-described embodiment, the present invention is however not necessarily limited to such a serial access memory. A dynamic RAM which comprises a dynamic type memory cell of a type wherein information is stored in a capacitor, and are separately provided read and write paths, can provide the same advantageous effect as the above-described embodiment.

Further, as an alternative to the transistor QP responsive to the column selection signal WP for connecting the internal write data transmission signal line IL to the write bit line WB, transistors which constitute a logic circuit for selecting an operation mode or decoder circuit for selecting a desired address, or the like may serially be provided. Even with this construction, the same advantageous effect as the above-described described embodiment can be obtained Furthermore, a description has been made on the serial access memory of such a type that the writing of data therein and reading data therefrom are executed on a bit unit. However, if a dynamic RAM, which comprises three-transistors/one capacitor type memory cells and also has data write and read paths arranged separately, is adopted, the same advantageous effect as the above-described embodiment can be attained.

In the above describe embodiments, a memory cell includes three transistors and one capacitor. The present invention can apply to a memory device including one-transistor and one-capacitor type memory cells, which will be described in the following.

Figure 11:
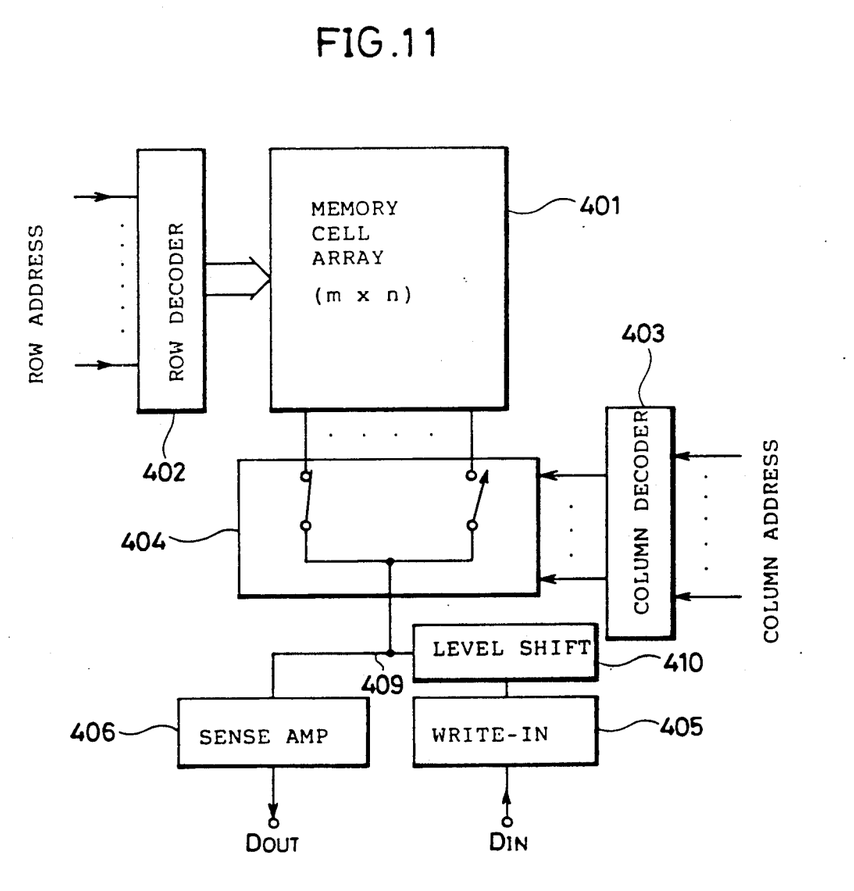
FIG. 11 shows the overall structure of the memory device according to further another embodiment of the present invention.

Referring to FIG. 11, a semiconductor memory device according to further another embodiment of the invention comprises a memory cell array 401 including a plurality of memory cells arranged in M rows and N columns.

The memory device also includes a row decoder 402 for decoding externally applied row address to generate a row select signal for selecting one row in the memory cell array 401, and a column decoder 403 for decoding externally applied column address to generate a column select signal for selecting a column in the memory cell array 401.

If the memory device is of the type that 1 word comprises n bits, the column select signal selects or designates n columns in the memory cell array 401 at a time. However, in the following description, one word of the memory device shown in FIG. 11 is assumed to comprise one bit.

In addition, a row address buffer is usually provided to buffer externally applied row address for application to the row decoder 402, and a column address buffer is also provided to buffer is also provided to buffer externally applied column address for application to the column decoder 403. However, it is assumed for convenience that these address buffers are included in respective decoder 402 and 403.

The memory device further includes a column select gate 404 for connecting a selected column to ta read/write data line 409 in response to a column select signal from the column decoder 403, a write-in circuit 405 for generating an internal write-in data corresponding to externally applied write-in data (input data) $D_{IN}$, and a sense amplifier circuit 406 for amplifying data read out from a selected memory cell to produce an external read out data (output data) $D_{OUT}$.

The memory device further includes a level shifting circuit 410 for shifting up the level of "L" data towards "H" level by an appropriate potential.

In operation, row decoder 402 selects one row in the memory cell array 401 in response to externally applied row address, and column decoder 403 selects one column in the array 401 in response to externally applied column address. A memory cell located on the selected row and the selected column is coupled to the read/write data line 409 through the column select gate 409. In writing data, write-in circuit 405 is enabled to produce internal write-in data corresponding to input data $D_{IN}$. Then the internal write-in data is transmitted to the selected memory cell through level shift circuit 410 and column select gate 404 to be stored therein.

In reading data, sense amplifier circuit 406 is enabled to detect and amplify the data on the read/write data line 409 from the selected memory cell to produce an output data $D_{OUT}$.

In reading data, the write-in circuit 405 is disabled to have its output at high-impedance.

Sense amplifier circuit 406 may be disabled or be enabled in writing data, and either case will do if the data input pin terminal and data output pin terminal are separately provided. If pin terminal is commonly employed for input data and output data, the sense amplifier circuit 406 is disabled in writing data.

Figure 12:
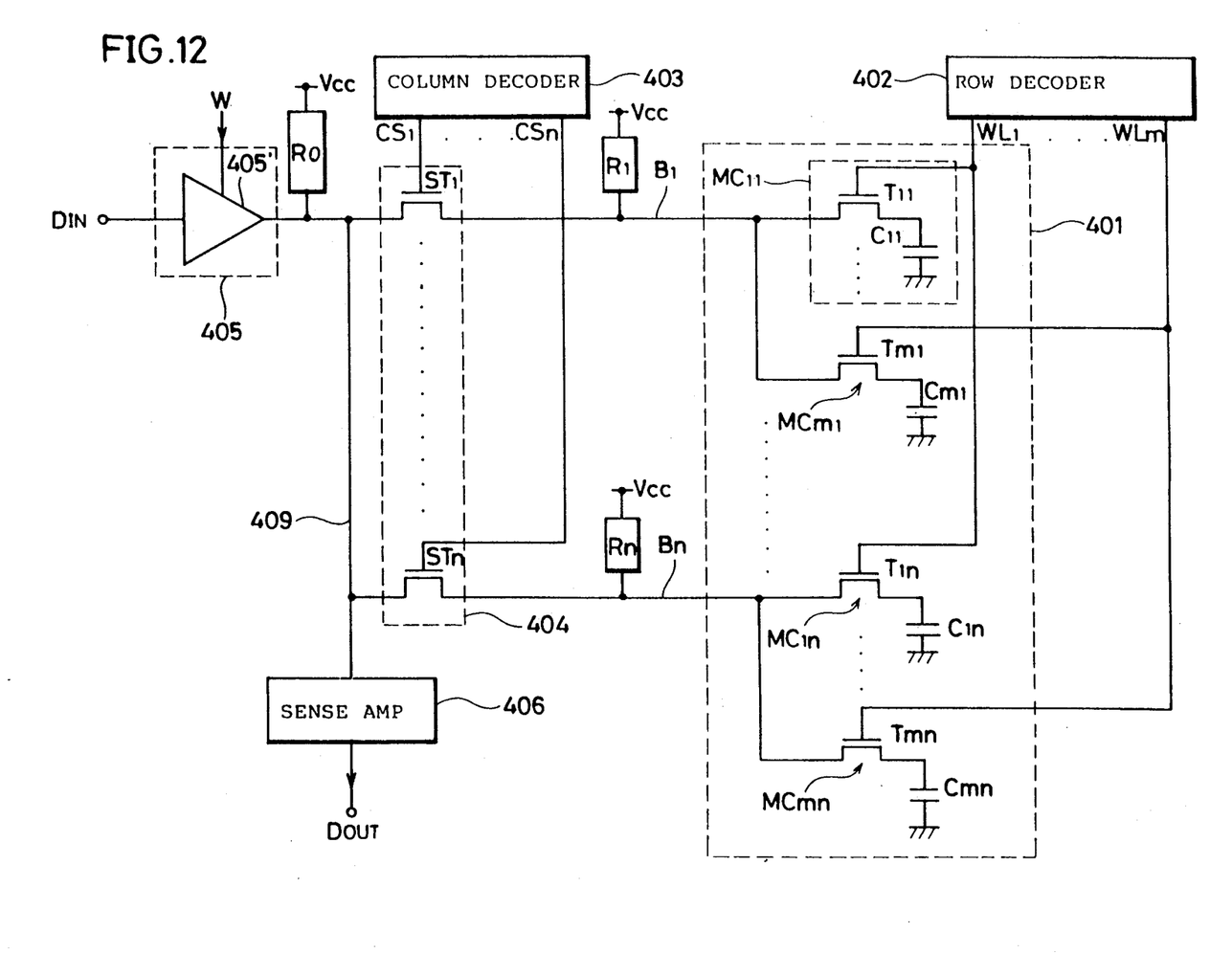
FIG. 12 shows a specific arrangement of the main portion of the device of FIG. 11.

FIG. 12 shows a specific arrangement of the device shown in FIG. 11.

Referring to FIG. 12, row decoder 402 includes m outputs connected to respective word lines WL1 through WLm.

Memory cell array 401 includes memory cells M11 to Mmn arranged in m rows and n columns. Memory cells Mi1 to Min are connected to word line WLi, where i is any integer among 1 to m. Memory cells M1j to Mmj are connected to bit line Bj, where j is any integer among 1 to n.

Memory cells of one row are connected to a word line, while memory cells of one column are connected to a bit line.

Each of memory cells M11 to Mmn includes a capacitor Cij for storing information in the form of electric charges, and a transfer transistor Tij responsive to a row select signal WLi for coupling the capacitor Cij to bit line Bj. It is noted that row select signal is referred by the same reference character as that of a word line.

Column select gate 404 includes a plurality of column gate transistors ST1 to STn one for each of bit lines B1 to Bn. Column gate transistor STj turns on to connect bit line Bj to read/write data line 409 in response to column select signal CSj from the column decoder 403 which in turn includes n outputs CS1 to CSn for generating a column select signal.

In writing data, one word line and one bit line are selected in response to a row select signal and a column select signal, respectively. Then, internal write-in data is transmitted onto the selected bit line to be stored in the selected memory cell.

In this case, the write-in circuit 405 has a large driving ability to cause undershooting of potential on the selected bit line, as shown in FIG. 4. This situation is now considered.

It is now assumed that the word line WL1 is selected by the row decoder 402 and the bit line B1 is selected by the column decoder 403. When internal write-in data of "L" is transmitted from write-in circuit 405 through column gate transistor ST1 onto the bit line B1, data of "L" is written in the memory cell MC11. If undershooting of potential on bit line B1 is caused as shown in FIG. 4, parasitic transistor of the transfer transistor Tm1 in off state is turned on to discharge the stored data charges in the capacitor Cm1, because the memory cell Mij also comprises the same cross sectional structure as shown in FIG. 3. Discharging of stored data is also caused in other memory cells connected to the bit line B1 due to the undershooting, resulting in deterioration in data retention characteristic, and ultimately in data inversion of "H" to "L".

Though not clearly shown in Fg. 12, a sense amplifier is provided for each bit line Bj for restoring memory cell data. This sense amplifier detects and amplifies and latches data on the associated bit line. In writing data, the sense amplifiers for respective bit lines B1 to Bn are activated, and then the write-in circuit 405 is enabled to transmit internal write-in data onto a selected bit line through a turned-on column gate transistor. The write-in circuit 405 has larger driving ability than data latching ability of these sense amplifiers to make the potential on the selected bit line corresponding to the write-in data.

Under such situation, if data of "H" is latched by a sense amplifier on the selected bit line, transmission of data of "L" by the write-in circuit 405 causes the undershooting on the selected bit line.

In addition, if read/write data line 409 is kept at an intermediate potential before writing data, writing data of "L" by the write-in circuit 405 to the selected memory cell storing data of "L" also causes the undershooting because the write-in circuit 405 discharges the read/write data line 409 at the intermediate level to the ground level.

Further, in a fast access mode such as a static column mode and a page mode wherein different columns are successively selected while a word line is kept being selected, writing of data "L" following the writing of "H" data causes the undershooting on the read/write data line 409, which undershooting is transferred onto the selected bit line even if the selected memory cell stores previously data of "L".

In any cases, the write-in circuit 405 has a large driving ability to charge and discharge the read/write data line 409 and bit lines B1 to Bn, the undershooting is inevitably generated on the bit lines B1 to Bn to degrade the data retention characteristic of the memory device, and to cause erroneous data reading due to reduced "H" level or inversion of stored data of "H" to "L".

In order to avoid turning-on of parasitic transistor in a transfer transistor Tij due to the undershooting, impedance elements R0 to Rn are provided at the output of the write-in circuit 405 and on respective bit lines B1 to Bn for shifting up the potential of "L" data, in FIG. 12.

The amount $\Delta V$ of shift-up of the potential of "L" data on a bit line Bj is determined by the same expression as that for the arrangement shown in FIG. 7, that is, $$\Delta V = R \cdot V_{cc}/(R0//Rj + R)$$

where R is on-resistance of a pull-down transistor included at the output stage of write-in buffer 405' for the write-in circuit 405, and Rj is resistance value of the impedance element Rj. It is noted that the direct current resistance of read/write data line 409 and respective bit lines B1 to Bn is assumed to be negligible as compared to R and Rj.

By such arrangement, the potential on a selected bit line can be made above the substrate potential Vss even if the undershooting is generated, so that any parasitic transistor can reliably be kept turned off to prevent leakage of stored data charges of a memory cell to a bit line.

For the impedance elements, any type of resistance can be employed such as polysilicon diffusion resistance having impurities doped into polysilicon and a resistance/connected MOS transistor as shown in FIG. 12.

In the arrangement in FIG. 12, impedance element is provided both at the output of write-in buffer 405' and on a bit line Bj. However, the impedance element may be provided either at the output of write-in buffer 405' or respective bit lines B1 to Bn.

In addition, the write-in buffer 405' may comprises the level shifting arrangement as shown in FIG. 7 without provision of impedance element, as far as the buffer 405, has its output at high impedance in response to the control signal W in data reading.

In addition, although in the memory device of FIG. 12, reading of data and writing of data is performed employing commonly the read/write data line 409, data reading path and data writing path may be provided separately.

A description has been made on a dynamic RAM in which each of the transistors in the memory cells is constructed by the nMOS transistor in the above-described embodiment. However, even when the memory cells comprised of the pMOS transistors are adopted as an alternative, the same effect as the aforementioned embodiment can be obtained if the voltage polarity has only to be reversed.

According to the present invention, as has been described above, even when the ringing takes place upon writing of data onto the (write) bit line and the undershoot occurs thereon, the achievable potential of the undershoot can be set to such a potential level that the parasitic bipolar transistors associated with the memory cells can always be kept in an OFF state. As a consequence, electric charges stored in capacitors in the memory cells are prevented from leaking to the (write) bit line. It is possible to obtain a high-reliability dynamic RAM which can retain data stably.

If insulated gate type field effect transistors are resistance-connected to be employed as impedance elements, such impedance elements can be formed using the same production steps as those for the memory cells. In addition, the impedance value thereof can be set to the optimal values with minimal occupation area by adjusting the size of the impedance transistor, thereby making it possible to perform correction of the signal potential with high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic RAM including a data write circuit for producing bilevel internal write data having first logic potential level and second logic potential level in response to externally applied write data, at least one internal write data transmission line for transmitting said bilevel internal write data therethrough, and a plurality of memory cells arranged in at least one column, said memory cells each including capacitor means for storing information in the form of electric charges therein, and a first selective connection element for selectively connecting said capacitor means to said internal write data transmission line in response to a write row selection signal, said dynamic RAM comprising:

level shifting means for shifting the level of potential of said internal write data corresponding to said second logic potential level transmitted onto said internal write data transmission line to the direction of a first potential.

2. A dynamic RAM according to claim 1, wherein said data write circuit has an output stage including a first output element for setting said internal write data transmission line to the first potential level in response to an externally applied write data and a second output element for setting said internal write data transmission line to a second potential level in response to an externally applied write data, and said level shifting means includes shifting elements for shifting the level of an output from said second output element to the direction of the first potential level.

3. A dynamic RAM according to claim 2, wherein said second output element comprises a first switching transistor connected between an output node of said data write circuit and a voltage supply source for supplying the second potential, and said shifting elements comprises a second switching transistor which turns on and off in response to said externally applied write data and a third switching transistor which controls on and off of said first switching transistor in response to said externally applied write data, said second switching transistor being provided so as to be Darlington-connected with said first switching transistor between said output node and a control electrode of said first switching transistor, and said second and third switching elements being operated complimentarily to each other.

4. A dynamic RAM according to claim 1, wherein said first selective connection element of said memory cell has one terminal connected to said internal write data transmission line, and said level shifting means includes impedance means provided to said internal write data transmission line between the output of said data write circuit and said one terminal of said first selective connection element, said impedance means for supplying, via its inherent impedance, the first potential to a point where it is located.

5. A dynamic RAM according to claim 4, wherein said impedance means includes an insulated gate type field effect transistor resistance-connected between said voltage supply source for the first potential and said point.

6. A dynamic RAM according to claim 1 further including at least one internal read data transmission line (OL RB) provided separately from said at least one internal write data transmission line and for transmitting data read from a selected memory cell therethrough, wherein each said memory cell further includes second selective connection element for selectively transmitting information stored in said capacitor means to said internal read data transmission line in response to a read row selection signal, and wherein said second selective connection element comprises first switching element for amplifying the information stored in said capacitor means and second switching element for transmitting the information amplified by said first switching element to said internal read data transmission line, and said first switching element has threshold voltage shifted to the direction of the first potential so as to compensate for the shifting of the level by said level shifting means, said threshold voltage specifying the transition voltage from an OFF state to an ON state of said first switching element.

7. A method of operating a dynamic RAM including data write circuits for producing bilevel internal write data in response to an externally applied write data, at least one internal write data transmission line for transmitting said bilevel internal write data therethrough, and a plurality of memory cells arranged in at least one column, each said memory cell including capacitor means for storing information in the form of electric charges therein, and a first selective connection element for selectively connecting said capacitor means to said internal write data transmission line in response to a write row selection signal, said method comprising the steps of:

shifting one logic level of said internal write data corresponding to a second potential to the direction of a first potential in response to said externally applied write data and transmitting the level-shifted internal write data to said internal write data transmission line; and writing said level-shifted internal write data into a selected memory cell.

8. The method according to claim 7, wherein said dynamic RAM further includes at least one internal read data transmission line provided separately from said at least internal write data transmission line and for transmitting data read from a selected memory cell therethrough, and wherein each said memory cell further includes second selective connection element for selectively transmitting information stored in said capacitor means to said internal read data transmission line in response to a read row selection signal, and said method further includes the step of compensating said second connection element for said shifted internal write data logic level.

9. The method according to claim 8, wherein said step of compensating comprises shifting the threshold voltage of said second selection element.

10. A method of operating a dynamic RAM including data write circuits for producing bilevel internal write data in response to an externally applied write data, at least one internal write data transmission line for transmitting said bilevel internal write data therethrough, and a plurality of memory cells arranged in at least one column, each said memory cell including capacitor means for storing information in the form of electric charges therein, and a first selective connection element for selectively connecting said capacitor means to said internal write data transmission line in response to a write row selection signal, said method comprising the steps of:

generating an internal write data in response to externally applied write data for transmitting the same onto said internal write data transmission line;

shifting one logic level corresponding to a second potential of said internal write data transmitted onto said internal write data transmission line, to the direction of a first potential; and writing said level-shifted internal write data into a selected memory cell.

11. The method according to claim 10, wherein said dynamic RAM further includes at least one internal read data transmission line provided separately from said at least internal write data transmission line and for transmitting data read from a selected memory cell therethrough, and wherein each said memory cell further includes second selective connection element for selectively transmitting information stored in said capacitor means to said internal read data transmission line in response to read row selection signal, and said method further includes the step of compensating said second connection element for said shifted internal write data logic level.

12. The method according to claim 10, wherein said step of compensating comprises shifting the threshold voltage of said second selection element.

13. A dynamic RAM including data write circuits for producing bilevel internal write data having first and second logic potentials in response to externally applied write data, at least one internal write data transmission line for transmitting said bilevel internal write data therethrough, a plurality of memory cells arranged in at least one column, said memory cells each including capacitor means for storing information in the form of electric charges therein, and a first selective connection element for selectively connecting said capacitor means to said internal write data transmission line in response to a write row selection signal, and wherein undershoot in said internal write data occurring upon transitions of said internal write data from said first logic potential to said second logic potential tends to turn on parasitic transistors formed in said memory cells, said dynamic RAM comprising:

level shifting means for shifting the level of the potential of said internal write data, transmitted onto said internal write data transmission line corresponding to the second logic potential, to the direction of the first logic potential while said write circuit is generating internal wire data having said second logic potential to prevent turn-on of said parasitic transistor as a result of said undershoot of said internal write data.

14. A dynamic RAM according to claim 13, wherein said data write circuit has an output portion including a first output element for setting said internal write data transmission line to the first potential in response to an externally applied write data and a second output element for setting said internal write data transmission line to a second potential in response to an externally applied write data, and said level shifting means includes shifting elements for shifting the level of an output from said second output element to the direction of the first potential while said write circuit is generating write data having said second logic level. level.

15. A method of operating a dynamic RAM including data write circuits for producing bilevel internal write data having first and second logic potentials in response to externally applied write data, at least one internal write data transmission line for transmitting said bilevel internal write data therethrough, a plurality of memory cells arranged in at least one column, said memory cells each including capacitor means for storing information in the form of electric charges therein, and a first selective connection element for selectively connecting said capacitor means to said internal write data transmission line in response to a write row selection signal, and wherein undershoot in said internal write data occurring upon transitions of said internal write data from said first logic potential to said second logic potential tends to turn on parasitic transistors formed in said memory cells, said method comprising the steps of:

shifting the level of the potential of said internal write data, transmitted onto said internal write data transmission line corresponding to the second logic potential, to the direction of the first logic potential while said write circuit is generating internal wire data having said second logic potential to prevent turn-on of said parasitic transistor as a result of said undershoot of said internal write data.

* * * * *